(12) United States Patent
Leaming

(10) Patent No.: US 7,080,789 B2
(45) Date of Patent: Jul. 25, 2006

(54) SMART CARD INCLUDING A JTAG TEST CONTROLLER AND RELATED METHODS

(75) Inventor: Taylor J. Leaming, Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 204 days.

(21) Appl. No.: 10/458,696

(22) Filed: Jun. 10, 2003

(65) Prior Publication Data

US 2004/0222305 A1 Nov. 11, 2004

Related U.S. Application Data

(63) Continuation-in-part of application No. 10/435,124, filed on May 9, 2003, now Pat. No. 6,783,078.

(51) Int. Cl.
    *C06K 19/06* (2006.01)
(52) U.S. Cl. ............... 235/492; 235/438; 370/240; 370/346
(58) Field of Classification Search ................ 235/492, 235/438; 370/240, 364; 324/765; 710/315; 455/561; 709/239; 714/729
    See application file for complete search history.

(56) References Cited

U.S. PATENT DOCUMENTS

| | | | | |
|---|---|---|---|---|
| 5,608,337 A | * | 3/1997 | Hendricks et al. | 324/765 |
| 6,006,303 A | | 12/1999 | Barnaby et al. | 710/244 |
| 6,122,676 A | | 9/2000 | Brief et al. | 710/9 |
| 6,157,966 A | | 12/2000 | Montgomery et al. | 710/8 |
| 6,157,975 A | | 12/2000 | Brief et al. | 710/104 |
| 6,188,912 B1 | * | 2/2001 | Struhsaker et al. | 455/561 |
| 6,402,026 B1 | | 6/2002 | Schwier | 235/379 |
| 6,439,464 B1 | | 8/2002 | Fruhauf et al. | 235/492 |
| 6,463,537 B1 | | 10/2002 | Tello | 713/182 |

(Continued)

FOREIGN PATENT DOCUMENTS

WO 00/16255 3/2000

(Continued)

OTHER PUBLICATIONS

Information Technology-Identification Cards-Integrated Circuit(s) cards with Contacts, part 12: USB Interface and Operating Procedures, ISO/IEC 2002, pp. 1-19, (no month, no year).

*Primary Examiner*—Karl D. Frech
*Assistant Examiner*—Allyson N Trail
(74) *Attorney, Agent, or Firm*—Lisa K. Jorgenson; Christopher F. Regan

(57) ABSTRACT

An integrated circuit for a smart card may include a transceiver for communicating with a host device and a Joint Test Action Group (JTAG) test controller for performing at least one test operation. Further, the integrated circuit may also include a processor for causing the JTAG test controller to initiate the at least one test operation based upon receiving at least one test request from the host device via the transceiver. More particularly, the processor may convert the at least one test request to JTAG data for the JTAG test controller. That is, the integrated circuit advantageously allows communications between the host device and the JTAG controller via a system bus, for example, without the need for a dedicated JTAG test access port (TAP) which is typically required for accessing JTAG controllers.

44 Claims, 3 Drawing Sheets

U.S. PATENT DOCUMENTS

| | | | |
|---|---|---|---|
| 6,523,081 B1 | 2/2003 | Karlsson et al. | 710/305 |
| 6,547,150 B1 | 4/2003 | Deo et al. | 235/492 |
| 2001/0056513 A1 | 12/2001 | Ueda | 710/100 |
| 2002/0066791 A1 | 6/2002 | Leydier et al. | 235/492 |
| 2002/0138801 A1* | 9/2002 | Wang et al. | 714/729 |
| 2003/0093609 A1* | 5/2003 | Drabczuk et al. | 710/315 |
| 2003/0198185 A1* | 10/2003 | Stancil | 370/241 |
| 2003/0206547 A1* | 11/2003 | Cho | 370/364 |
| 2004/0172482 A1* | 9/2004 | Weissman et al. | 709/239 |

FOREIGN PATENT DOCUMENTS

| | | |
|---|---|---|
| WO | 02/23357 | 3/2002 |

* cited by examiner

SMART CARD INCLUDING A JTAG TEST CONTROLLER AND RELATED METHODS

CROSS-REFERENCE TO RELATED APPLICATIONS

This application is a continuation-in-part of U.S. patent application Ser. No. 10/435,124, filed May 9, 2003 now U.S. Pat. No. 6,783,078, which is hereby incorporated herein in its entirety by reference.

FILED OF THE INVENTION

The present invention relates to the field of information processing and storage, and, more particularly, to smart card systems and related methods.

BACKGROUND OF THE INVENTION

Smart cards are becoming increasingly more popular for security and personal identification applications. For example, smart cards are currently being used for storing sensitive data such as medical records, banking information, etc. In perhaps their most common form, smart cards have a card body which resembles a credit card in size, shape, and thickness, and they may even be made out of similar materials, such as plastic. Yet, rather than simply having a magnetic stripe to store sensitive information (e.g., account numbers, user identification, etc.) as standard credit cards do, smart cards generally include an integrated circuit (IC). The IC not only includes a non-volatile memory for storing such sensitive information, but it may also include a microprocessor for processing this information and communicating with a host device via a card reader, for example. Accordingly, not only can smart cards store more information than magnetic stripe cards, but they also have much greater functionality.

Various protocols have emerged to standardize the operation and communications of devices such as smart cards. One of the earliest of these was developed by the International Organization for Standardization (ISO) and is known as the ISO 7816-X protocol. In particular, this protocol is set forth in ISO documents ISO 7816-1 (Physical Characteristics), ISO 7816-2 (Dimensions and Locations of Contacts), ISO 7816-3 (Electronic Signals and Transmission Protocols), ISO 7816-10 (Electronic Signals and Answer to Reset for Synchronous Cards), and ISO 7816-2 (USB Interface), for example, all of which are hereby incorporated herein in their entirety by reference.

Furthermore, in response to the increasing popularity of the universal serial bus (USB) architecture, increasing numbers of smart cards continue to be developed which operate in accordance with the USB protocol. This protocol is set forth in the Universal Serial Bus Specification, Revision 2.0, Apr. 27, 2000, published by USB Implementers Forum, Inc., which is hereby incorporated herein in its entirety by reference. The USB architecture is particularly advantageous in that it provides a standard "plug and play" interface for devices external to a computer, for example. That is, external peripheral devices can be relatively quickly and easily installed and removed from a computer without having to open or power down the computer.

While the ISO 7816-X and USB protocols provide certain basic tools and rules for developing smart card systems, there still remain many practical challenges to smart card implementation. One such challenge is the testing of smart card IC designs. That is, in addition to the microprocessor and non-volatile memory, numerous other components are typically included in a smart card IC for communicating with the host device and performing smart card operations. For example, these additional components may include transceivers, transmission buffers, interface circuitry, random access memory (RAM) for the microprocessor, internal clocks, state machines, etc. Thus, a relatively large number of tests may be required to ensure that each of these components operates as intended under different operating constraints or with different data sets.

Perhaps the most common approach for testing the operation of IC components is to use manufacturing-grade IC test machines. While such test machines are capable of testing many of the above circuit components, these machines can cost hundreds of thousands or even millions of dollars to purchase and operate. Thus, it will typically be practical to have only a very limited number of such test machines. Yet, to test most or all of the above IC components for each IC manufactured can be cost prohibitive because this requires that each IC spend a relatively long time on the tester. This, in turn, slows production and thus increases per unit costs. As such, a minimal set of operating tests may be defined to ensure basic components are operating correctly, but this could mean many other functions will go untested.

Because of the computing power resident in the microprocessor of the smart card IC, certain testing operations may be performed internally to the smart card. By way of example, U.S. Pat. No. 6,157,966 to Montgomery et al. is directed to an ISO 7816 type smart card which uses debugging applications resident on the card to aid in the development of smart card programs. The debugging applications can provide internal state and runtime information, such as for a memory test. Results from the test are then output and may include a number of rows or columns of a memory unit that passed the test.

Despite the advances provided by the above-noted approach, further improvements in smart card testing may be needed in certain areas. One such area is USB smart cards, for example, which are continuing to gain popularity and will likely need to be manufactured in ever increasing quantities.

SUMMARY OF THE INVENTION

In view of the foregoing background, it is therefore an object of the present invention to provide an integrated circuit for a smart card with enhanced testing features and related methods.

This and other objects, features, and advantages in accordance with the present invention are provided by an integrated circuit for a smart card which may include a transceiver for communicating with a host device and a Joint Test Action Group (JTAG) test controller for performing at least one test operation. Further, the integrated circuit may also include a processor for causing the JTAG test controller to initiate the at least one test operation based upon receiving at least one test request from the host device via the transceiver.

More particularly, the processor may convert the at least one test request to JTAG data for the JTAG test controller. That is, the integrated circuit advantageously allows communications between the host device and the embedded JTAG controller via a system bus, for example, without the need for a dedicated embedded (i.e., internally integrated) JTAG test access port (TAP), which is typically required for accessing embedded JTAG controllers. Indeed, providing such a JTAG port on a smart card may not be practical in many applications due to the relatively small size of smart card integrated circuit chips.

In accordance with one embodiment of the invention, the integrated circuit may include a USB transceiver, and the processor may operate in a USB mode. As such, the at least one test request may advantageously be implemented using at least one test vendor specific request (VSR), as provided for by the USB Specification, for example. Because of the enhanced security requirements typically associated with smart card applications, the processor may also authenticate the at least one test request prior to causing the JTAG test controller to initiate the at least one test operation, if desired.

By way of example, the at least one test operation may include one or more of the following: a boundary scan test; a serial shift loop scan test; a built-in self test (BIST); a current leakage test (i.e, an $I_{DDQ}$ test); and generating at least one automated test pattern. Additionally, the integrated circuit may further include at least one register connected to the test controller. As such, the at least one test operation may include at least one of reading data from and writing data to the at least one register. Furthermore, the integrated circuit may also include a clock circuit for providing a reference clock signal for the JTAG test controller.

A smart card in accordance with the invention may include a smart card body and an integrated circuit, such as the one described briefly above, carried by the smart card body. Such a smart card may also be included within a smart card system further including a host device and a smart card adapter connected to the host device for reading the smart card.

A method aspect of the invention is for testing an integrated circuit for a smart card including a Joint Test Action Group (JTAG) test controller. The method may include receiving at least one test request from a host device, and, responsive to the at least one test request, causing the JTAG test controller to initiate at least one test operation.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
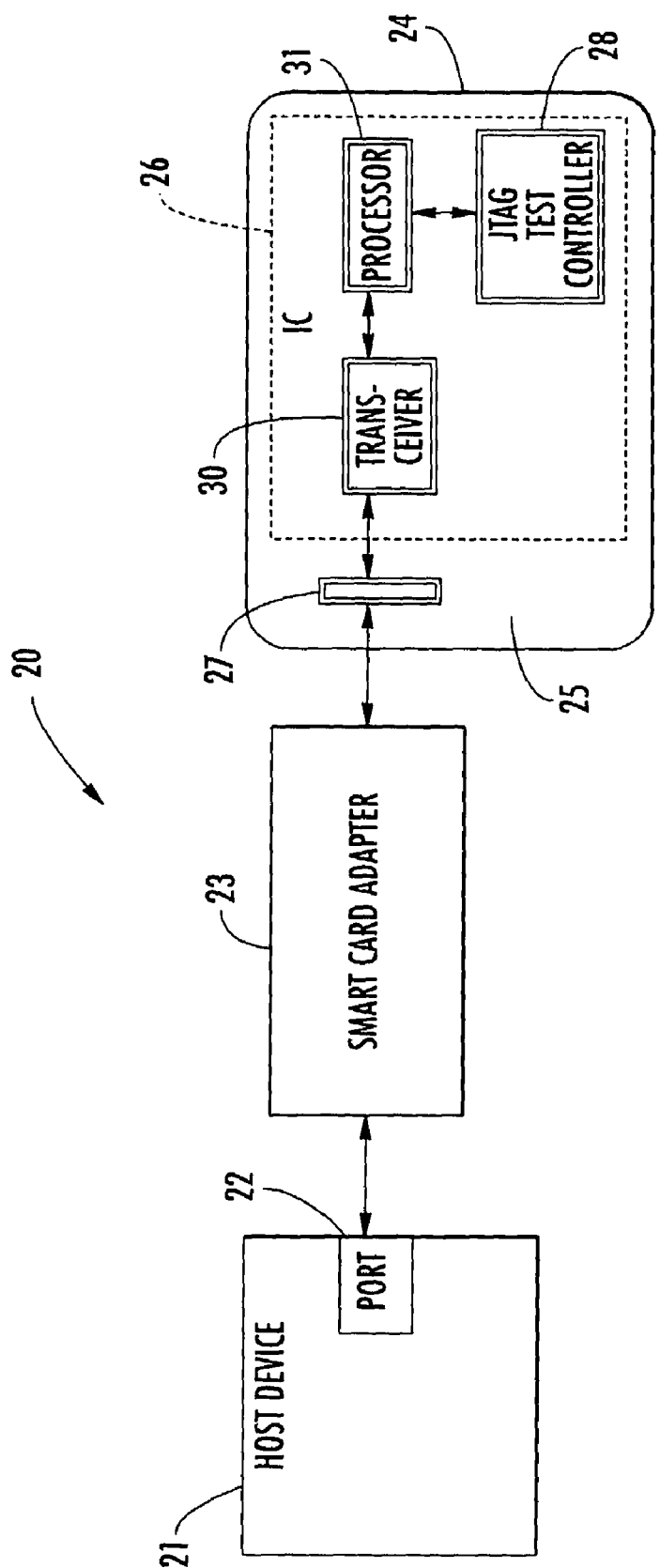
FIG. 1 is a schematic block diagram of a smart card system in accordance with the present invention.

Referring initially to FIG. 1, a smart card system 20 in accordance with the present invention illustratively includes a host device 21 having a communications port 22, a smart card reader or adapter 23 connected to the communications port, and a smart card 24 to be read by the smart card reader. Generally speaking, the host device 21 will be a computer of some type, which could be a personal computer (PC), laptop, etc., for example. Of course, smart card systems take many forms, so the host device 21 could be any number of computing devices capable of interfacing with a smart card, such as a cable or satellite television receiver/decoder, an automated teller machine (ATM) or other banking machine, a point-of-sale (POS) device (e.g., a cash register), etc., depending upon the given application. Another example would be a personal data assistant (PDA) or other USB device that is ordinarily a slave to a USB bus master (i.e., a host device), but when used in a USB on-the-go (OTG) mode can itself act as a limited USB bus master.

In the case of an ISO 7816 type smart card system, the port 22 may be a serial communications port connected to the internal bus of the host device 21 (not shown). In the case of a USB type smart card system, the port 22 will be a USB port which is also connected to the internal bus of the host device 21, as will be appreciated by those of skill in the art. The smart card system 20 of the present invention may advantageously be implemented as an ISO 7816 type system, a USB system, or a dual mode system which operates in both modes, for example, similar to the system described in U.S. Pat. No. 6,439,464 to Fruhauf et al., assigned to the assignee of the present invention, and which is hereby incorporated herein in its entirety by reference. Of course, other suitable smart card formats may also be used, as will be appreciated by those of skill in the art.

The smart card adapter 23 is of a type compatible with the particular operational protocol being implemented in the system 20 (e.g., an ISO 7816 type card reader, a USB type card reader, etc.). Of course, multiple readers 23 may be used, as well as multi-purpose readers which read more than one type of smart card or multi-mode smart cards. In addition, the card reader 23 can be remotely located with respect to the host device 21, but it need not be. That is, in some embodiments the card reader 23 can be incorporated within the host device 21 or carried by a housing thereof, as will be appreciated by those of skill in the art. Additionally, in some embodiments the smart card adapter 23 may be incorporated into a smart card integrated chip (see below), reducing the "reader" to little more that a "pass through" connector.

The smart card 24 illustratively includes a card body 25 and an integrated circuit (IC) 26 carried by the card body. Further, the smart card 24 also illustratively includes contacts 27 for providing an electrical connection between the smart card adapter 23 and the IC 26. Of course, it will be appreciated that in some embodiments the smart card 24 may in fact be wireless and thus not require the contacts 27. In such event, an antenna may be used instead of the contacts 27, for example. Yet, for clarity of explanation, the present application will refer particularly to the examples of ISO 7816 and USB type smart cards, each of which uses a respective connector configuration defined by the various protocol documents noted above. Thus, the use of physical contacts 27 on the card body 25 (and corresponding contacts at the card adapter 23) will be assumed for purposes of the present discussion.

It should be noted that the smart card body 25 may be made of various types of materials and take various shapes. Perhaps the most common material used for smart cards is plastic, but other suitable materials may also be used. Moreover, smart cards are also generally rectangular in shape and thin enough to fit in a wallet, similar to a credit card, but again, other shapes and thicknesses may be used. The IC 26 may be encased within the card body 25, as illustratively shown, or it may be recessed therein but still exposed. Other mounting configurations are possible, as will be appreciated by those of skill in the art, which are anticipated by the present invention. It should also be noted that the smart card 24 may be incorporated or built into another device as a token or identification circuit therefor, for example.

The IC 26 illustratively includes a transceiver 30 which is connected to the contacts 27 and sends/receives signals to/from the host device 21 via the smart card adapter 23, as will be appreciated by those of skill in the art. The transceiver 30 is controlled by a processor 31 which also performs the various smart card operations supported by the smart card 24. In accordance with the present invention, the smart card 24 also illustratively includes a Joint Test Action Group (JTAG) test controller 28 for advantageously performing one or more test operations upon initiation by the processor 31, for example, as will be explained further below.

As will be appreciated by those of skill in the art, a JTAG test controller is one which complies with the Institute of Electrical and Electronics Engineers, Inc. (IEEE) Test Access Port and Boundary-Scan Architecture standard IEEE-1149.1-2001, which is hereby incorporated herein in its entirety by reference. Generally speaking, the IEEE-1149.1 standard provides a protocol which may be used to test the operation and/or physical interconnections of semiconductor devices. Further general information on the operation, functionality, and advantages of JTAG devices beyond that discussed herein may be found in "IEEE Std 1449.1 (JTAG) Testability Primer" from Texas Instruments, Inc., 1997, which is hereby incorporated herein in its entirety by reference.

The implementation of the JTAG test controller 28 embedded within the integrated circuit 26 advantageously allows such tests to be performed internally, which can significantly decrease (if not eliminate, in some circumstances) the amount of testing time that will be required on the expensive IC test machines noted above and also can be performed under otherwise unsecured conditions.

Figure 2:
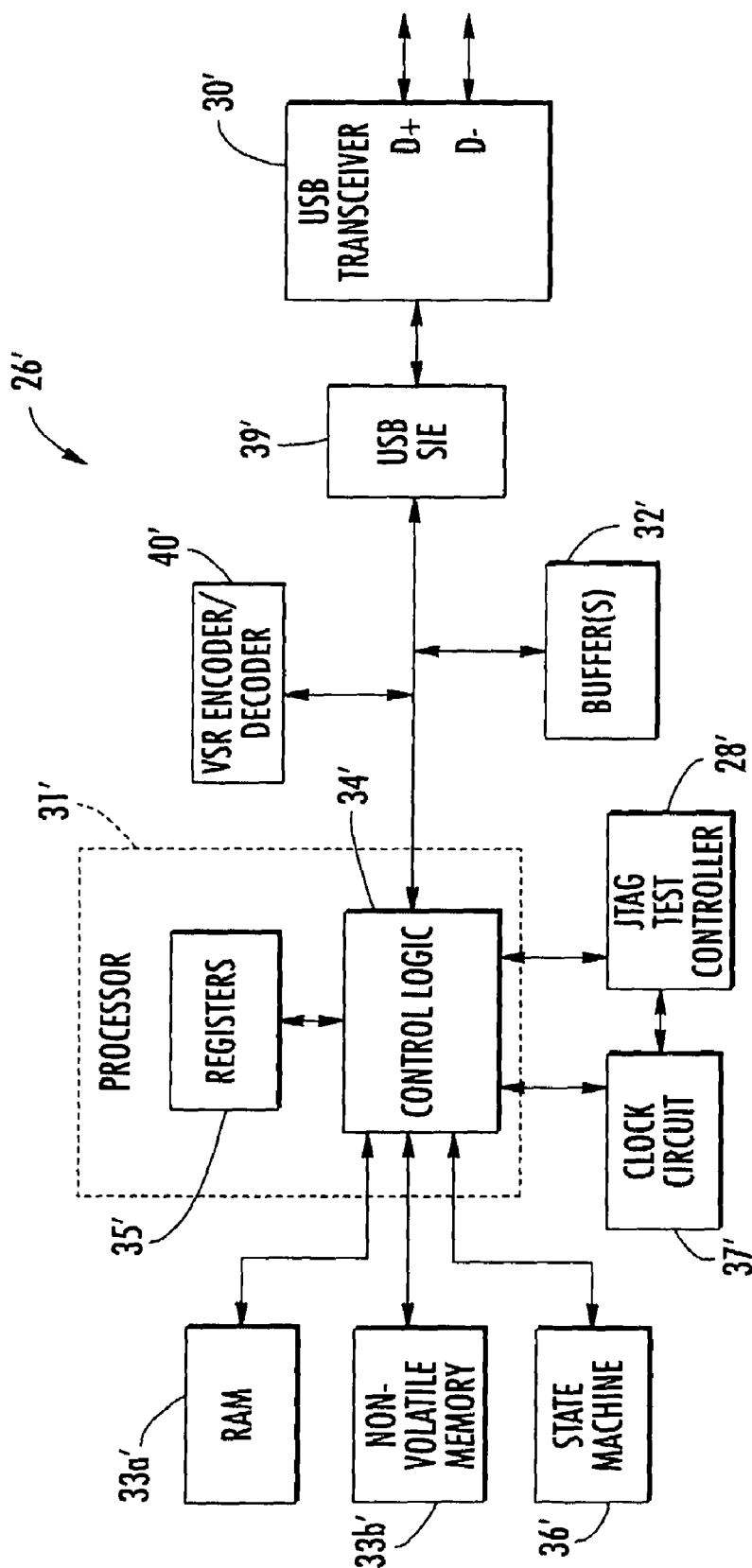
FIG. 2 is a schematic block diagram illustrating the smart card integrated circuit of FIG. 1 in greater detail.

Various exemplary test operations and other features of the invention will now be described with reference to an exemplary embodiment of the IC 26' illustrated in FIG. 2 which operates in a USB mode. In the illustrated embodiment, the IC 26' includes a USB transceiver 30' which includes first and second data input/outputs (I/Os) D+ and D−, as set forth in the USB Specification. Moreover, in the illustrated embodiment the processor 31' includes control logic 34' and one or more registers 35' for use by the control logic in performing various smart card operations, as will be appreciated by those skilled in the art. Furthermore, one or more buffers 32' are preferably included within the IC 26' for buffering signals transmitted between the IC and the host device 21.

Moreover, the IC 26' also illustratively includes random access memory (RAM) 33a', and non-volatile memory 33b' (e.g., electrically erasable programmable read only memories (EEPROMs), etc.). The RAM 33a' may be used for temporarily storing data to be processed, for example, while the non-volatile memory 33b' may be used for storing permanent and/or semi-permanent information which needs to be retained by the IC 26' when not connected to (and powered by) the smart card adapter 23 (e.g., device descriptors, configuration descriptors, interface descriptors, endpoint descriptors, string descriptors, supported USB requests, etc.).

In some embodiments, the IC 26' may optionally include a state machine 36' for performing certain dedicated processing functions, as will be discussed further below. Moreover, a clock circuit 37' may also be included in the IC 26' for providing an operating clock signal for the JTAG test controller 28'. Of course, the clock signal may by used by the processor 31' as well. By way of example, upon first being connected to the smart card adapter 23, as part of an internal initialization or enumeration the IC 26' may receive a current system time from the host device 21, which may then be used as a starting value for the clock circuit 37' to maintain the current system time for the control logic 34' and JTAG test controller 28'.

The IC 26' also illustratively includes a USB serial interface (SIE) engine 39' connected between the USB transceiver 30' and the microprocessor 31' which is for translating USB encoded data received from the host device 21 to a serial data stream for the control logic 34', and vice-versa for data being sent upstream to the host device. Moreover, a VSR encoder/decoder 40' may also optionally be connected between the USB transceiver 30' and the microprocessor 31' for encoding/decoding "non-standard" USB data which would not ordinarily be handled by a standard USB serial interface engine, such as vendor specific requests (VSRs). VSRs will be discussed in greater detail below. Of course, it should be noted that in some embodiments the functionally of the USB SIE 39' and/or VSR encoder/decoder 40' could be implemented within the microprocessor 31', if desired, or within a same interface device.

The USB Specification defines a base set of USB requests for communications in USB systems, some or all of which may be used by a particular vendor for a given product and stored in the non-volatile memory 33b'. Furthermore, in addition to the base set of USB requests, the USB Specification also provides a mechanism by which product vendors may enhance and personalize the USB communications between the host device 21 and smart card 24. That is, the USB Specification provides for the use of VSRs to define additional operations which are appropriate for a given smart card device or application. Further information on the format and use of VSRs may be found in the above-noted parent of the present application.

In typical prior art JTAG controller implementations, the IEEE-1149.1 standard calls for the use of a dedicated physical JTAG test access port (TAP) and related I/O pins for interfacing with the controller. This is sometimes done through the use of shared package pins to provide access to an internal JTAG port, as part of a test mode, by managing the functional behavior of external pads and pins. Another approach is to use additional chip pads during manufacturing and testing, which then become inaccessible after the final packaging. While these approaches may be acceptable for implementing JTAG controllers in relatively large scale applications, such as in computers or on circuit boards, smart cards are generally much smaller in size and, as a result, are highly constrained with respect to I/O availability.

Yet, in accordance with the present invention, the processor 31' may advantageously cause the JTAG test controller 28' to initiate a test operation(s) based upon receiving one or more test requests, such as test VSRs, from the host device 21 via the USB transceiver 30'. That is, the JTAG serial scan test protocol data, which includes commands and data, is preferably incorporated within VSRs to be sent between the host device 21 and the JTAG test controller 28'. This may be done by using the available USB transfer modes, similar to how the serial transmission protocols of the ISO 7816 standard is managed for USB smart card devices, for example, as will be appreciated by those of skill in the art.

The control logic 34' and state machine 36' may then cooperate with the VSR encoder/decoder 40' to interpret the encapsulated JTAG data and manage the JTAG test controller 28' in the same fashion as if dedicated external JTAG equipment were physically attached to a TAP port on the smart card 24. In this way, the control logic 34' (and/or state machine 36'/VSR encoder/decoder 40') implement a "virtual" TAP or interface between the host device 21 and the JTAG test controller 28'. Consequently, it is possible to perform a wide variety of scan-based access and testing, for example, along with the normal functions of the smart card 24, over the same USB system bus and without interference with other USB traffic on the bus, as will be appreciated by those of skill in the art.

The virtual TAP may be implemented as a JTAG addressable TAP (or similar functionality) macrocell or HDL model of the same by the control logic 34', for example. In some embodiments optional features may be included, such as user defined data registers, etc., for accessing the JTAG test controller 28'. The implementation of the virtual TAP is preferably such that the test functionality is physically, functionally and electrically isolated from the I/O pads of the IC 26', and instead interfaces to the USB system bus and the embedded serial scan structures to avoid the need for a physical TAP on the smart card 24. Of course, in some embodiments, a physical TAP connector may be implemented on a smart card device, if desired, and such embodiments are also anticipated by the present invention.

As will be appreciated by those skilled in the art, the virtual TAP manages the requisite TAP control signals (e.g., TCLK, TRST, TMS, TDI, TDO, etc.) for the JTAG test controller 28'. The functionality of the state machine 36' may be directed by an incoming stream of JTAG instructions, for example. In addition, some control and status signals may also be provided by the "primary" functions or applications being implemented by the smart card 24 in some embodiments, if desired. Also, the virtual TAP may cooperate with the buffers 32 to provide buffering for one or more JTAG input vectors (e.g., stimulus, mask, compare, etc.) and/or output vectors or data (e.g., response, results vectors, etc.).

Furthermore, one or more scan chains or other test structures may be included within the IC 26' for implementation of the virtual TAP as required for a given device or environment. By way of example, the scan chains may be used to perform any type of JTAG-accessible testing, such as, but not limited to: access to the results of embedded BIST, LBIST, MBIST, LSFR, or other tests; read and/or write access to onboard diagnostic registers and controls; control of device current leakage (i.e., $I_{DDQ}$) test modes; performing boundary scan tests between the various "blocks" of the IC 26'; performing automated test pattern generation (ATPG), etc., as will be appreciated by those of skill in the art. Further information regarding JTAG serial scan loop methodology may be found in the IEEE 1149.1 standard.

Because of the enhanced security requirements associated with many smart card applications, it may be desirable in some embodiments to limit access to the JTAG test controller 28' using privileged access mechanisms. That is, it may be desirable for the processor 31' to authenticate test requests prior to causing or allowing the JTAG test controller 28' to initiate test operations. Thus, the control logic 34' may optionally determine if access to the JTAG test controller 28' is to be granted based upon any suitable secure authentication technique, such as challenge-answer or by an encrypted password, for example, as will be appreciated by those of skill in the art. Of course, given that the format of VSRs may be proprietary to the product manufacturer, the mere fact that the JTAG data is incorporated in valid VSRs may provide adequate security in some embodiments.

A suitably-crafted software module, such as for use with a JTAG software package installed on the host device 21, may also be installed on the host device 21 to complement the JTAG software package. That is, the software module allows the JTAG software package to access and utilize the USB communications libraries, and therefore the USB bus, instead of using dedicated hardware that ordinarily physically connects to a JTAG TAP of the device-under-test, which in turn connects to the computer by parallel, serial, or some other access port. Depending upon the given implementation, the software module may take the form of a software plug-in, a USB driver, a stand-alone application, etc.

In any event, the JTAG data is appropriately managed for transfer between the host device 21 and smart card 24 using one or more of the USB transfer modes and endpoints, as will be appreciated by those skilled in the art. The organization of these transfer modes could be mixed. For example, the JTAG commands could be sent using a USB control mode pipe, the stimulus data sent using a bulk OUT pipe, and the results from using the stimulus vector (i.e., either the entire scan-out "raw" vector, or the internally-generated "compare" result(s)) retrieved using a bulk IN pipe.

An example of a typical use of the above-described system 20 is as follows. A computer operating as the host device 21 controls the USB bus hierarchy in which the smart card 24 to be tested is introduced. The smart card 24 (or any other USB Device which implements a JTAG test controller 28 in accordance with the invention) is plugged into a USB port anywhere on the computer's USB bus. A JTAG-based test program is run on the computer, along with any other desired development tools The JTAG program itself may be a standard "off-the-shelf" software package, with the sole exception that it utilizes the USB bus rather than some other port (e.g., serial, parallel, SCSI, etc.) to communicate with the JTAG test controller 28. The user proceeds in whatever nature of development or usage is appropriate for the given application. The JTAG software package may be used to retrieve information via the JTAG test controller 28, or to manipulate any JTAG-accessible controls, registers, etc. Such manipulations could be made along with normal functional operations of the smart card 24.

Figure 3:
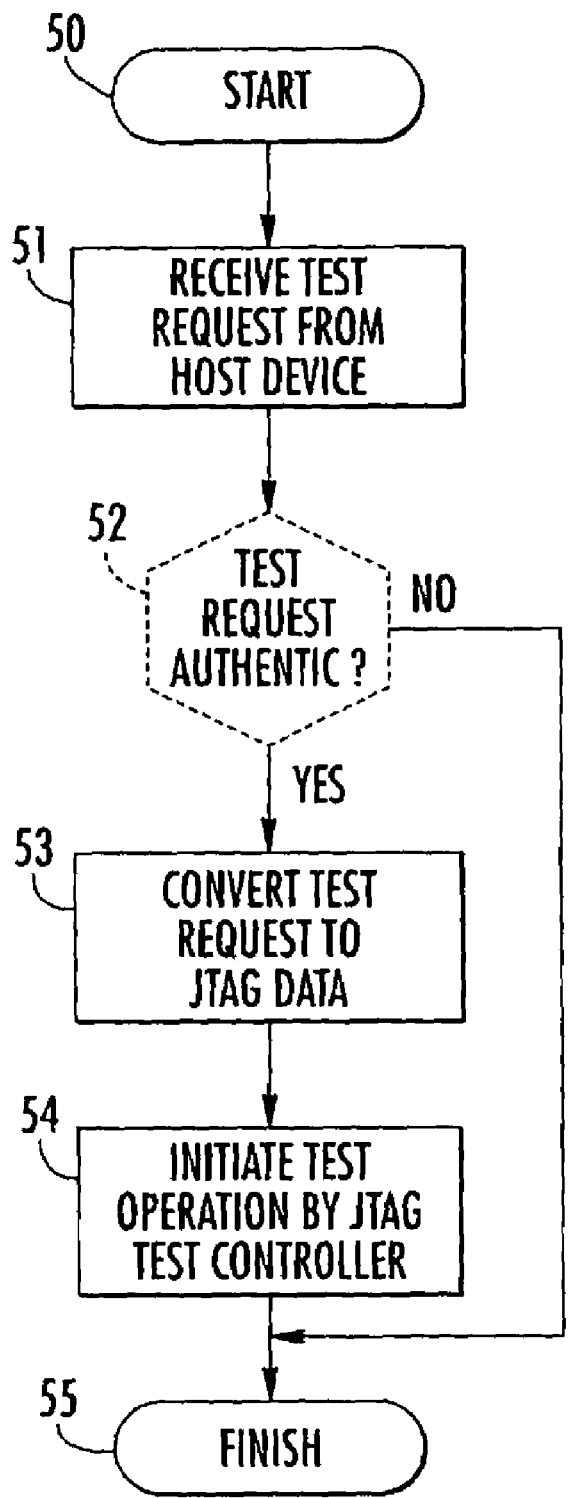
FIG. 3 is a flow diagram illustrating a method in accordance with the present invention.

A method aspect of the invention for testing the smart card integrated circuit 26 will now be described with reference to FIG. 3. The method begins (Block 50) with receiving at least one test request from the host device 21. The at least one test request may then optionally be authenticated, if desired (Block 52). If the test request is authenticated, the at least one test request is converted to JTAG data for the JTAG test controller, at Block 53, and the at least one test operation initiated, at Block 54, as previously described above, thus concluding the illustrated method (Block 55). If it is not authenticated, the test request may be ignored, and other appropriate security or reporting measures may be taken, as will be appreciated by those of skill in the art.

Based upon the foregoing description, numerous advantages of the present invention will be appreciated by those skilled in the art. For instance, the present invention advantageously allows access to an embedded and internally-isolated JTAG test controller within a smart card, as well any interconnected serial shift loop architectures associated therewith. Moreover, a wide variety of scan-based access and test structures may be implemented (e.g., BIST, LFSR, etc.), along with the normal functions of the smart card, over the same system bus and without interfering with other USB traffic on the bus through the use of the virtual TAP.

Indeed, the use of the virtual TAP advantageously allows JTAG functionality to be implemented not only in smart card devices, but other devices which are similarly highly constrained with respect to space availability and, thus, available I/Os. Consequently, in accordance with the present invention there is no need for function-multiplexed I/O pins on a product, which saves additional complexity of I/O implementations. Plus, since the present invention allows for the elimination of a dedicated JTAG TAP, this provides savings in terms of device cost, and may also reduce the need for dedicated external JTAG hardware test equipment, thereby further reducing costs.

Additionally, the present invention may advantageously allow developers to access embedded applications for debug and development, which would ordinarily not be possible without the presence of a JTAG port. Moreover, it provides vendors of smart card devices and similar security sensitive products with secure access to embedded diagnostic and analysis structures within their proprietary USB-based products. Further, the present invention also allows in-field diagnostics to be performed on USB devices, which would otherwise not be possible. It should also be noted that the present invention may advantageously be implemented regardless of the bus speed of the USB (or other) device (e.g., low speed, full speed, or high speed in the case of USB). By way of example, the present invention may also be used with other technologies, such as Firewire, Ethernet, Bluetooth, Wireless (802.11xx), PCMCIA, ISO 7816 (as an extension), etc.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. An integrated circuit for a smart card and comprising:
   a universal serial bus (USB) transceiver for communicating with a host device;
   a Joint Test Action Group (JTAG) test controller for performing at least one test operation; and
   a processor operable in a USB mode for causing said JTAG test controller to initiate the at least one test operation based upon receiving at least one test request from the host device via said USB transceiver, and including control logic, a state machine and VSR encoder/decoder, wherein said control logic and state machine are operative with said VSR encoder/decoder to interpret encapsulated JTAG data and manage the JTAG test controller.

2. The integrated circuit of claim 1 wherein said processor converts the at least one test request to JTAG data for said JTAG test controller.

3. The integrated circuit of claim 1 wherein the at least one test operation comprises a boundary scan test.

4. The integrated circuit of claim 1 wherein the at least one test operation comprises a serial shift loop scan test.

5. The integrated circuit of claim 1 wherein the at least one test operation comprises a built-in self test.

6. The integrated circuit of claim 1 further comprising at least one register connected to said test controller, and wherein the at least one test operation comprises at least one of reading data from and writing data to said at least one register.

7. The integrated circuit of claim 1 wherein the at least one test operation comprises a current leakage test.

8. The integrated circuit of claim 1 wherein the at least one test operation comprises generating at least one automated test pattern.

9. The integrated circuit of claim 1 wherein said processor authenticates the at least one test request prior to causing said JTAG test controller to initiate the at least one test operation.

10. The integrated circuit of claim 1 further comprising a clock circuit for providing a reference clock signal for said JTAG test controller.

11. The integrated circuit of claim 1 wherein the at least one test request comprises at least one test vendor specific request (VSR).

12. A smart card comprising:
    a smart card body; and
    an integrated circuit carried by said smart card and comprising
      a universal serial bus (USB) transceiver for communicating with a host device,
      a Joint Test Action Group (JTAG) test controller for performing at least one test operation, and
      a processor operable in a USB mode for causing said JTAG test controller to initiate the at least one test operation based upon receiving at least one test request from the host device via said USB transceiver, and including control logic, a state machine and VSR encoder/decoder, wherein said control logic and state machine are operative with said VSR encoder/decoder to interpret encapsulated JTAG data and manage the JTAG test controller.

13. The smart card of claim 12 wherein said processor converts the at least one test request to JTAG data for said JTAG test controller.

14. The smart card of claim 12 wherein the at least one test operation comprises a boundary scan test.

15. The smart card of claim 12 wherein the at least one test operation comprises a serial shift loop scan test.

16. The smart card of claim 12 wherein the at least one test operation comprises a built-in self test.

17. The smart card of claim 12 wherein said integrated circuit further comprises at least one register connected to said test controller, and wherein the at least one test, operation comprises at least one of reading data from and writing data to said at least one register.

18. The smart card of claim 12 wherein the at least one test operation comprises a current leakage test.

19. The smart card of claim 12 wherein the at least one test operation comprises generating at least one automated test pattern.

20. The smart card of claim 12 wherein said processor authenticates the at least one test request prior to causing said JTAG test controller to initiate the at least one test operation.

21. The smart card of claim 12 wherein said integrated circuit further comprises a clock circuit for providing a reference clock signal for said JTAG test controller.

22. The smart card of claim 12 wherein the at least one test request comprises at least one test vendor specific request (VSR).

23. A smart card system comprising:
    a host device;
    a smart card adapter connected to said host device; and a smart card to be read by said smart card adapter and comprising a smart card body and an integrated circuit carried by said smart card body, said integrated circuit comprising
- a universal serial bus (USB) transceiver for communicating with a host device,
- a Joint Test Action Group (JTAG) test controller for performing at least one test operation, and
- a processor operable in a USB mode for causing said JTAG test controller to initiate the at least one test operation based upon receiving at least one test request from the host device via said USB transceiver, and including control logic, a state machine and VSR encoder/decoder, wherein said control logic and state machine are operative with said VSR encoder/decoder to interpret encapsulated JTAG data and manage the JTAG test controller.

24. The smart card system of claim 23 wherein said processor converts the at least one test request to JTAG data for said JTAG test controller.

25. The smart card system of claim 23 wherein the at least one test operation comprises a boundary scan test.

26. The smart card system of claim 23 wherein the at least one test operation comprises a serial shift loop scan test.

27. The smart card system of claim 23 wherein the at least one test operation comprises a built-in self test.

28. The smart card system of claim 23 wherein said integrated circuit further comprises at least one register connected to said test controller, and wherein the at least one test operation comprises at least one of reading data from and writing data to said at least one register.

29. The smart card system of claim 23 wherein the at least one test operation comprises a current leakage test.

30. The smart card system of claim 23 wherein the at least one test operation comprises generating at least one automated test pattern.

31. The smart card system of claim 23 wherein said processor authenticates the at least one test request prior to causing said JTAG test controller to initiate the at least one test operation.

32. The smart card system of claim 23 wherein said integrated circuit further comprises a clock circuit for providing a reference clock signal for said JTAG test controller.

33. The smart card system of claim 23 wherein the at least one test request comprises at least one test vendor specific request (VSR).

34. A method for testing an integrated circuit for a smart card comprising a Joint Test Action Group (JTAG) test controller and a universal serial bus (USB) transceiver coupled thereto, the method comprising:
- receiving at least one test request from a host device via the USB transceiver; and
- responsive to the at least one test request, causing the JTAG test controller to initiate at least one test operation, and including control logic, a state machine and VSR encoder/decoder, wherein said control logic and state machine are operative with said VSR encoder/decoder to interpret encapsulated JTAG data and manage the JTAG test controller.

35. The method of claim 34 further comprising converting the at least one test request to JTAG data for the JTAG test controller.

36. The method of claim 34 wherein the at least one test operation comprises a boundary scan test.

37. The method of claim 34 wherein the at least one test operation comprises a serial shift loop scan test.

38. The method of claim 34 wherein the at least one test operation comprises a built-in self test.

39. The method of claim 34 wherein the integrated circuit further comprises at least one register connected to the test controller; and wherein the at least one test operation comprises at least one of reading data from and writing data to the at least one register.

40. The method of claim 34 wherein the at least one test operation comprises a current leakage test.

41. The method of claim 34 wherein the at least one test operation comprises generating at least one automated test pattern.

42. The method of claim 34 further comprising authenticating the at least one test request prior to causing the JTAG test controller to initiate the at least one test operation.

43. The method of claim 34 further comprising providing a reference clock signal for the JTAG test controller.

44. The method of claim 34 wherein the at least one test request comprises at least one test vendor specific request (VSR).

* * * * *